(12) United States Patent  (10) Patent No.: US 8,874,392 B2
Drews  (45) Date of Patent: Oct. 28, 2014

(54) EVALUATION METHOD

(75) Inventor: Peter Drews, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 336 days.

(21) Appl. No.: 13/278,348

(22) Filed: Oct. 21, 2011

(65) Prior Publication Data

US 2012/0101751 A1    Apr. 26, 2012

Related U.S. Application Data

(63) Continuation of application No. 12/316,354, filed on Dec. 11, 2008, now abandoned.

(30) Foreign Application Priority Data

Jan. 1, 2008  (EP) ..................................... 07024889

(51) Int. Cl.
| | |
|---|---|
| *G01R 21/00* | (2006.01) |
| *H01L 31/02* | (2006.01) |
| *H01L 31/042* | (2014.01) |
| *H01L 31/18* | (2006.01) |
| *G01R 31/40* | (2014.01) |

(52) U.S. Cl.
 CPC .............. *H01L 31/02* (2013.01); *H01L 31/042* (2013.01); *G01R 31/405* (2013.01); *Y02E 10/50* (2013.01); *H01L 31/186* (2013.01)
 USPC .......................................................... 702/60

(58) Field of Classification Search
 USPC .......................................................... 702/60
 See application file for complete search history.

(56) References Cited

U.S. PATENT DOCUMENTS

| | | | |
|---|---|---|---|
| 5,352,300 | A  | 10/1994 | Niwa |
| 5,439,533 | A  | 8/1995  | Saito et al. |
| 5,648,731 | A  | 7/1997  | Decker et al. |
| 7,709,727 | B2 | 5/2010  | Roehrig et al. |
| 2004/0264225 | A1 | 12/2004 | Bhavaraju et al. |
| 2005/0172995 | A1 | 8/2005  | Rohrig et al. |

FOREIGN PATENT DOCUMENTS

| | | |
|---|---|---|
| EP | 0534473 A2  | 3/1993 |
| WO | 03098703 A2 | 11/2003 |

OTHER PUBLICATIONS

Henrik Bindner, Lifetime Modelling of Lead Acid Batteries, Risø National Laboratory, Roskilde, Denmark, Apr. 2005, p. 1-81.*

(Continued)

*Primary Examiner* — Tung S Lau
(74) *Attorney, Agent, or Firm* — Eschweiler & Associates, LLC

(57) ABSTRACT

A method for determining a power reduction due to ageing of a photovoltaic module includes measuring a variable associated with a performance of the module in one or more time periods within a given year, each time period defining a class, and constructing curves of discrete values, each power curve constructed from the measured electric variable at a plurality of times of a day within each class, and the curves constructed for a plurality of years. The method includes determining energy values based on the constructed curves for at least one class for each of the plurality of years, and determining a power reduction of the photovoltaic module with respect to one or several previous years by calculating a difference between the energy output values of a given class in a particular year and the energy output values of the given class in a year previous to the particular year.

10 Claims, 5 Drawing Sheets

(56) References Cited

OTHER PUBLICATIONS

Weidong Xiao, Topology Study of Photovoltaic Interface for Maximum Power Point Tracking, IEEE Transactions on Industrial Electronics, vol. 54, No. 3, Jun. 2007, pp. 1696-1704.*

A.M. Reis, From the Proceedings of the 29th IEEE Photovoltaics Specialists Conference New Orleans, Louisiana May 2002, Comparison of PV Module Performance Before and After 11-Years of Field Exposure, Chamberlin Schatz Energy Research Center, Humboldt State University, Arcata, CA 95521, p. 1-4.

Pratt R.G. et al. "Performance of a 4 kW amorphous-silicon alloy photovoltaic array at Oakland Community College, Auburn Hills, Michigan", 19880926; 19880926—19880930, Sep. 26, 1988, pp. 1272-1277. XP010750513, full document.

Wenger H.J. et al. "Decline of the Carrisa Plains PV power plant: the impact of concentrating sunlight on the flat plates", Proceedings of the photovoltaic specialists conference. Las Vegas, Oct. 7-11, 1991; (Proceedings of the photovoltaic specialists conference), New York, IEEE, US, Bd. Conf. 22, Oct. 7, 1991, pp. 586-592, XP010039235, ISBN: 978-0-87942-636-1, full document.

R.N. et al. "Field studies of performance § reliability of heterogeneous 2 photo-voltaic modules for optimum array design", Eedings of the photovoltaic specialists conference. Las Vegas, Oct. 7, 19911 007; 19911 007 19911011 New York, IEEE, US, Bd. Conf. 22, Oct. 7, 1991, pp. 689-694, XP 010039302, ISBN: 978-0-87942-636-1, full document.

Trucker et al. "A review offield performance of EVA-based encapsulats", Conference record of the 29th IEEE photovoltaic specialists conference 20020519; 20020519-2002050524 New York, NY: IEEE, US, Bd. Conf. 29, May 19, 2002, ISBN: 978-0-7803-7471-3, full document.

Non-Final Office Action dated Mar. 14, 2011 for U.S. Appl. No. 12/316,354. 13 Pages.

* cited by examiner

| Year \ Class | 1 | 2 | ... | K |
|---|---|---|---|---|
| 1 | $E_{1,1} - E_{1,2}$ | $E_{2,1} - E_{2,2}$ | ... | $E_{K,1} - E_{K,2}$ |
| 2 | $E_{1,2} - E_{1,3}$ | $E_{2,2} - E_{2,3}$ | ... | $E_{K,2} - E_{K,3}$ |
| ⋮ | ⋮ | ⋮ | | ⋮ |
| n | $E_{1,n-1} - E_{1,n}$ | $E_{2,n-1} - E_{2,n}$ | ... | $E_{K,n-1} - E_{K,n}$ |

EVALUATION METHOD

REFERENCE TO RELATED APPLICATIONS

This application is a continuation application of U.S. application Ser. No. 12/316,354, filed Dec. 11, 2008, which claims priority to European Patent Application No. 07024889.3, filed Jan. 1, 2008.

FIELD

The invention relates to an evaluation method for determining a power reduction due to aging of at least one photovoltaic module at constant radiation intensity by measuring an electrical variable that may vary after a while such as cell current, cell voltage and/or cell power without additional sensors for measuring the radiation intensity.

The power of solar cells or of photovoltaic modules is subject to aging. The loss of efficiency ranges from 10% to 20% over a period of time of 20 years.

For mounting, solar cells are combined into modules, so-called solar or photovoltaic modules or solar panels. After 20 years, a solar module only has 90% to 80% of the power indicated.

DESCRIPTION OF THE PRIOR ART

From a study "Pratt R. G. et al: "Power of a 4 kW amorphous-silicon alloy photovoltaic array at Oakland Community College, Auburn Hills, Mich." XP010750513" it is known to record the efficiency and the energy output of the plant over a short period of time. It appears from the study that the mere comparison of e.g., the energy output in the same month of e.g., two consecutive years does not allow inference on the aging of the PV modules since the values characterizing the energy output such as radiation intensity and temperature differ too much.

Methods are known, which are based on artificially accelerated aging tests. These tests are only performed for certain conditions such as temperature and irradiation and are thus usually allocated safety factors. Hence, the efficiency a manufacturer guarantees after a certain time is usually less than the actual efficiency drop. For such tests, additional sensors are moreover utilized for sensing for example the temperature or radiation intensity.

In practice, the power drop of the solar module is very difficult to follow over time. It is difficult to locate whether the power drop is within the limits indicated by the manufacturer since certain general conditions are needed for this purpose such as a certain outside temperature, precise sensors or calibratable radiation sensors and the like.

SUMMARY

It is the object of the invention to find a method of the type mentioned herein above by means of which a long-term power reduction of solar modules in an installed solar plant can be readily determined with high accuracy.

This object is solved by the following method steps:

fixing at least one class k, which is comparable on a year-to-year basis, within which a daily power curve or portions of the daily power curve of the photovoltaic module can be compared to each other on the basis of the radiation intensity and the outside temperature to be expected as well as of the radiation time, said class k corresponding to a defined time range, measuring energy output values $E_{k,n}$ that can be compared on a year-to-year basis from a comparable power curve $P_{k,n}(t)$ by the variable delivered by the photovoltaic generator so that energy differences will be determined on the basis of the classes k, n being the respective year, indicating a power reduction of the photovoltaic module with respect to one or more previous years of the energy output value $E_{k,n}$ immediately delivered by the photovoltaic module by calculating the difference from the energy outputs $E_{k,l}$ of the comparable years i, data of comparable days having a comparable power curve P(t) of the photovoltaic module are being observed over several years.

Further advantageous implementations of the invention are characterized in the dependent claims.

Thanks to the measurement method of the invention, it is possible to determine very precisely a long-term power reduction without the need of additional sensors.

The invention relies on the observation that comparable days in terms of radiation intensity and temperature of the solar plant can be found over several years, these days allowing a reliable statement with regards to power reduction thanks to their comparability. In order to ensure comparability in terms of solar radiation, it is possible to compare over the years days in which a power curve P(t) is almost identical for example. Since the radiation intensity and the radiation time fluctuate in the course of a year, the year is divided in several periods, i.e., in several classes k. k may for example be equal to 52 so that the comparison may be made weekly. The actual comparison then only occurs within one class k over the years n.

Accordingly, the invention relies on the idea consisting in observing the energy output of the solar plant over several years. Actual data are compared with the values in previous years. This allows locating in which way the energy output decreases over the years.

In every year, the days must be found at which the energy output of the solar plant is comparable with values of previous years in order to be capable of making a reliable statement in terms of power reduction.

Accordingly, for each year n, there may be a maximum of k energy values. These energy values can be compared to the energy values of a previous year, for example to those of the previous year or of the first year. The difference between the energy values is for example a measure of the power reduction. This difference can be normalized. The energy amount of the previous year may serve as a standard.

Accordingly, the invention allows observing over the years power reduction within one class. Thanks to this accurate measurement, a solar plant can thus be connected for a longer time to a grid without maintenance works. It is also possible to locate early increased power reduction so that photovoltaic modules can be exchanged in time.

To measure the energy output, a variable of the generator such as the generator current, the generator voltage or the generator power can be measured.

In an advantageous embodiment of the measurement method of the invention, there are provided at least two classes k, which are distributed over the year and within which the daily power curves or the portion of the daily power curve are comparable on the basis of the radiation intensity and the outside temperature as well as of the radiation time. This allows for taking into consideration the seasonal fluctuations of the radiation intensity and of the outside temperature as well as of the irradiation time to be expected.

Sensing or filing a daily curve of the power P of the generator as well as of the energy output E of the photovoltaic generator of the day is particularly advantageous, a day power curve P(t) being determined, the course of which is comparable to at least one day curve Pk,n(t) from previous years. Accordingly, a measurement of the day curve of the power of the solar generator P(t) as well as of the daily energy output Etag, i.e., of the two variables is advantageous. These values can be recorded and filed in a data bank, for example by means of a data logger. Within each class k, one day power curve Pk,n(t) the course of which is comparable to the day power curves Pk,i(t) from previous years can be determined for each year n. This also means that at most k energy output values Ek,n are determined for each year, said energy output values being compared to the energy output values Ek,l of the previous years i, for example the first year values Ek, 1 so that at the most k values are determined for the energy differences .DELTA.Ek,n. At least one of these energy differences .DELTA.Ek,n related to an energy output value Ek,i of a previous year, for example of the first year Ek,1 is used to indicate the power reduction of the solar generator.

Accordingly, within each class, one day or one measurement period is determined the power curve P(t) and the energy output E of which is comparable to measurements performed in earlier days.

It is advantageous that a number ktmax of day classes kj are formed. The day classes correspond to time periods that are associated with fixed time intervals and that are distributed over the daily sunshine period to be expected. This comparison then occurs between measurement intervals comprising both the same k and kj classes. One class may also be a class having a same pair of coefficients (k, kj) or a same tuple. In the variant widened to include the day classes, there is a maximum of k*kj energy values E((k,kj),n), which are compared to the energy values of the previous years. Differences and averages can be calculated here.

In an advantageous embodiment of the invention, comparable days are determined within one class in two steps at most, namely by calculating and evaluating the first derivation Pk'(t) of the function Pk(t).

The first derivation Pk'(t) of the data host Pk(t) is hereby calculated and it is checked whether certain limit values have been respected. If these limit values are exceeded or not reached, it can be assumed that this day was cloudless.

Alternatively, the first derivation Pk'(t) is calculated and evaluated by testing a curve area included therein for fixed limit values. In a first step, the first derivation Pk'(t) then enters an evaluation method which yields values that are not allowed to exceed or fall short of imposed limit values.

Using a plausibility criterion, it can be clearly determined in a second step whether the day is really cloudless. One plausibility criterion may for example be measurement data from the data host Pk(t) lying within tolerance bands such as a tolerance band for a certain region or a tolerance band for summer days and one for winter days. This means that this plausibility criterion is applied to the data host P(t) for example.

An alternative plausibility criterion is applied to the energy output Ek,tag. The energy output Ek,tag is not allowed to fall short of an imposed limit value either.

As an alternative or in addition thereto zero crossings of the first derivation Pk'(t) are advantageously evaluated in another implementation. A day is clearly cloudless if there is only one zero crossing. This evaluation method can be performed in only one step.

It is further sensible to impose limit values in the first year and to verify these limit values in the following years.

In another advantageous developed implementation of the method of the invention there is provided that at least one average value .DELTA.Emittel is calculated from the k energy difference values .DELTA.Ek,n for the year n as a measure for power reduction. By calculating the average, it is possible to make a very precise statement about the aging condition of the solar cells. The advantage of this way of proceeding is that quotients or percentage values obtained thereby, meaning daily and weekly values, can be averaged both for the k and for the kj classes. One thus obtains a very wide statistical basis, which ensures good accuracy of the values.

A particular benefit is obtained if a daily power curve is determined, which substantially comprises a daily power maximum. This case occurs if the day is cloudless. In this variant of the invention, only energy values from measurement periods are compared in which there was no shadow. Shadowing can be recognized with the methods mentioned herein above.

In this variant, time periods of shadow are recognized by evaluating the change in luminosity occasioned by passing clouds. In principle, one locates the change in luminosity by calculating the derivation of the power generated by the solar plant with respect to time. High values of such a derivation are evaluated by an evaluation algorithm which calculates whether the time range of the measurement was influenced by clouds. An effect of benefit is obtained by implementing an evaluation standard through fix or adaptive threshold values. An evaluation standard with amount averages, quadratic averages or other values can be utilized. An advantage is obtained if a time range with shadowing is recognized by comparing the amount of power or energy generated in the time range with a comparative value. If there are significant negative differences, there were shadows. Such a comparative value can be generated from a model of radiation on a cloudless day. A comparative value can also be calculated from the radiation values of previous days, in particular if these corresponding time intervals were recognized to be cloudless. An effect of benefit is obtained if a comparative value is calculated from values of previous years that have been stored.

An exemplary embodiment will be described in closer detail with reference to the drawings, additional developed implementations of the invention and advantages thereof being described herein.

DETAILED DESCRIPTION

Figure 1A:
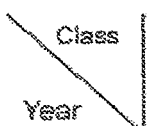
FIG. 1a shows a matrix for several years 1 through n as well as several classes 1 through k showing energy outputs.

FIG. 1a illustrates a matrix with energy output data for several years 1 through n, which are indicated in the matrix lines as well as for several classes 1 through k, which are indicated in the columns. The formulae below the matrix indicate the energy differences for each class k and for the respective year n. For each year n, one then has k energy values $E_{k,n}$. These energy values passing clouds can then be compared to the energy values $E_{k,1}$ of the year before i, of any previous year or of the first year. The difference $\Delta E_{k,n} = E_{k,i} - E_{k,n}$ is taken to measure the power reduction. This difference can be normalized. The energy output of the year before i can for example serve as a standard so that the power reduction can be expressed by $\Delta E_{k,n}/E_{k,i} = (E_{k,i} - E_{k,n})/E_{k,1}$ As a result, a power reduction of the photovoltaic modules can be observed within one class over several years.

Accordingly, in FIG. 1a, $\Delta E_{1,n}$ through $\Delta E_{k,n}$ signify energy differences for each class. $\Delta E^*_{1,n}$ means normalized energy differences for each class; this will be explained in closer detail later.

In accordance with the invention, the method is based on the measurement or on the acquisition of the daily curve of the power of the solar generator P(t) as well as on a daily energy output Etag. These data can be stored in a data bank.

Distributed over the year, there are several classes k. Two classes k are required though. This is beneficial in order to take into account a seasonal radiation intensity as well as a seasonal dependent outside temperature.

Within each class k, a power curve Pk,n(t) is determined for each year n, said curve having a course that is comparable with the daily power curves Pk,1 of previous years i.

I.e., for each year, a maximum number k of energy output values $E_{k,n}$ are ascertained, which are compared to the energy output values $E_{k,1}$ of the previous years, for example with the energy output values $E_{k,1}$, so that a maximum number k of values is determined for the energy differences $\Delta E_{k,n}$.

At least one of these energy differences $\Delta E_{k,n}$ related to an energy output value $E_{k,1}$ of a previous year i, for example of the first year value $E_{k,1}$, is used to indicate the power reduction of the photovoltaic generator.

Preferably, the energy outputs are related to one day. I.e., within each class one ascertains a day the power curve P(t) and the energy output E of which are comparable with measurements performed in earlier days. For each year n, one then has k energy values $E_{k,n}$, which relate to one day. These daily energy values $E_{k,n}$ can then be compared with the daily energy values $E_{k,n-1}$ of the year before or with the energy values $E_{k,1}$ of the first year or of any year.

Figure 1B:
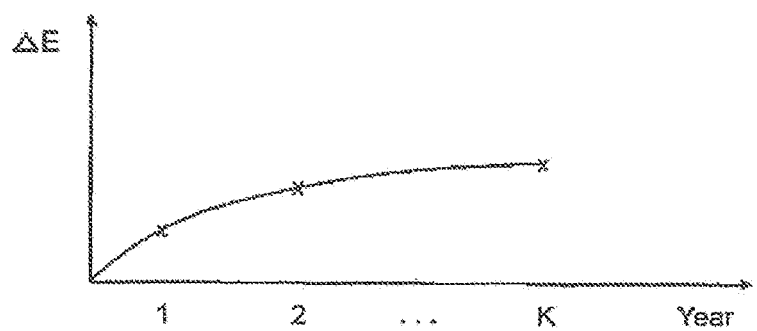
FIG. 1b shows a matrix comparable to that of FIG. 1a, this matrix now showing the energy differences.

In FIG. 1b there is shown another matrix which includes the energy differences for several years 1 through n as well as for all classes 1 through k. Below the matrix, there is shown a measurement graph showing the energy differences $\Delta E$ related to the years 1 through n.

From these variables, mean values from all the k energy differences $\Delta (E_{k,n})$ can be acquired for one year n, namely with the formula:

$$\Delta E_{mittel,n} = \sum_{1km=1}^{k} \Delta E_m, n \quad \#\#EQU00001\#\#$$

For normalized energy differences, the above mentioned formula takes the following form:

$$\Delta E_{mittel,n}^* = \sum_{1km=1}^{k} \Delta E_m, n^* \quad \#\#EQU00002\#\#$$

Then, the values $\Delta E_{mittel,n}$ or $\Delta E^*_{mittel,n}$ indicate a yearly average value for power reduction of the photovoltaic generator in the respective year n.

It is also possible to consider quadratic averages or an average to the power of p, i.e., $\Delta (E_{k,n})^p$ or $\Delta (E_{(k,kj)},n)^p$. As a result, a significant change in the values is possible through which the ageing process of the cells can be normalized. An effect of benefit is obtained if p is a constant comprised between 2 and 6. Hereinafter, location is described for comparable days.

Figure 2A:
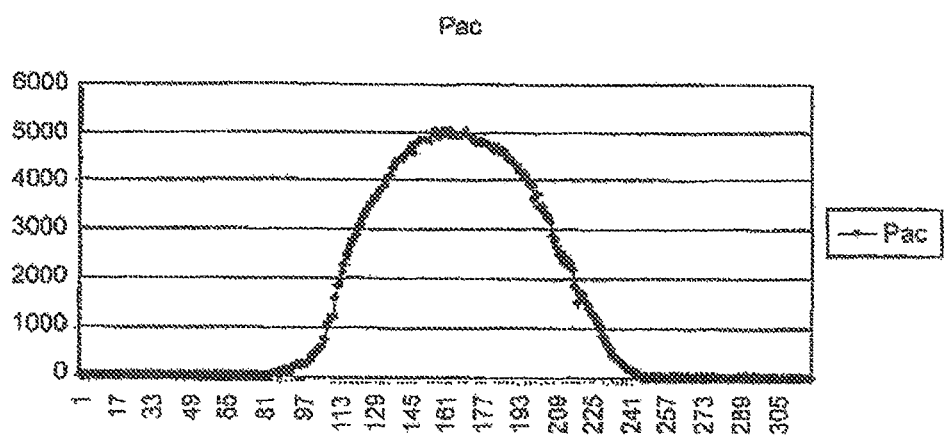
FIG. 2a shows a measured curve of the power P of a photovoltaic generator for a cloudless day.
Figure 3A:
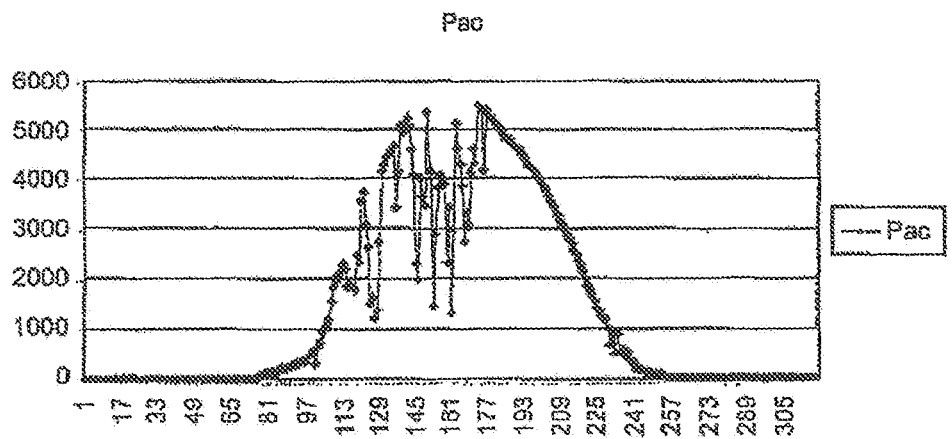
FIG. 3a shows a measured gradient of the power P of the photovoltaic generator for a day with passing clouds, is
Figure 4A:
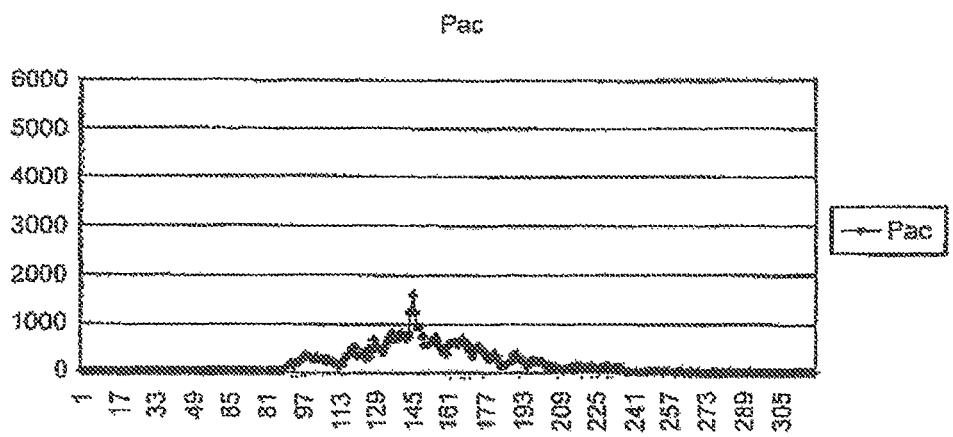
FIG. 4a shows the measured course of the power P of the photovoltaic generator for a cloudy day.

The FIGS. 2a, 3a and 4a show different daily power curves P(t) for different weather conditions. In FIG. 2a, the measured power curve is based on a cloudless day. In FIG. 3a, a measured curve of the power P of the solar generator is shown as a function of the time for a day with passing clouds, the sun irradiating periodically the photovoltaic generator through holes in said clouds. In FIG. 4a, the measured curve of the power P of the solar generator relates to a very cloudy day or to a day with constant weak solar radiation.

As shown in FIG. 2a, the radiation power of the sun increases at sunrise. About noon, it reaches its maximum peak. Toward sunset, the radiation falls toward zero again. FIG. 2a accordingly illustrates the measured curve of the power P of a photovoltaic generator or of one or more photovoltaic modules as a function of time t for a cloudless day. As can be seen from the curve, there is only one daily maximum with respect to power P. There is no power break due to passing clouds.

In FIG. 3a it can be seen that there are strong power fluctuations. The intensity of the radiation of the photovoltaic modules, which has changed because of the passing clouds, can be seen clearly.

If a day generates a curve as shown in FIG. 4a, the day is for example cloudy or rainy and the solar radiation quite low. Typically, this may be a winter day.

Accordingly, the FIGS. 2a, 3a and 4a show typical measured power curves P(t) for days with different weather conditions, these being in discrete form, i.e., they constitute effective measured variables. For simplicity's sake, these functions are shown schematically or as continuous functions in the FIGS. 2b, 3b and 4b. The discrete measurement data can also be transformed into continuous functions through appropriate interpolation methods.

Figure 2B:
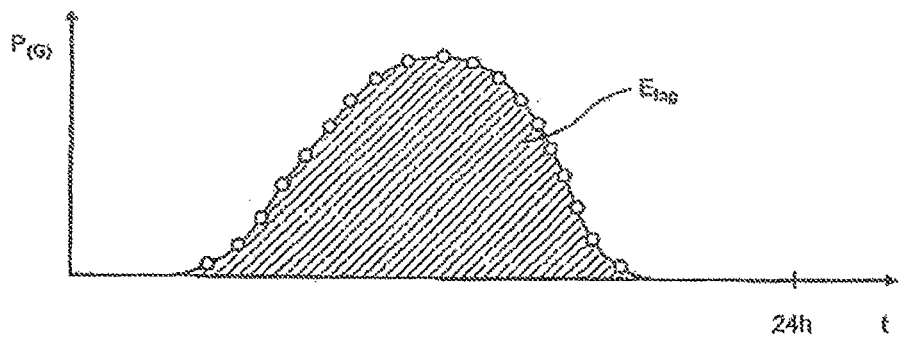
FIG. 2b shows a schematic course of the curve shown in FIG. 2a, FIG. 2c shows the course of the first derivation for the function shown in FIG. 2b.
Figure 2C:
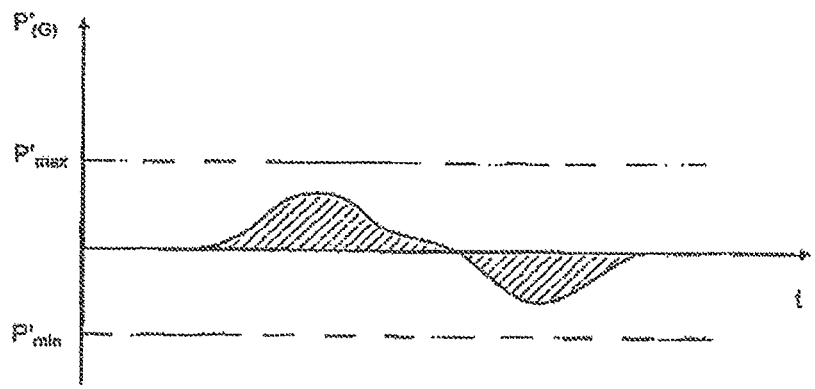
Figure 3B:
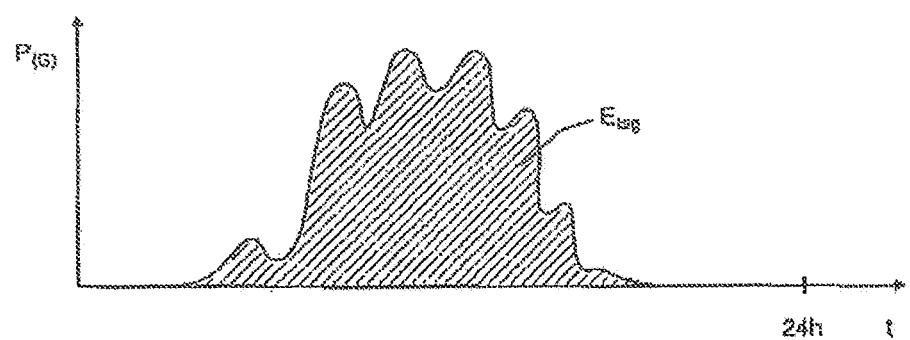
FIG. 3b shows a schematic curve of the power shown in FIG. 3a for the day with passing clouds.
Figure 3C:
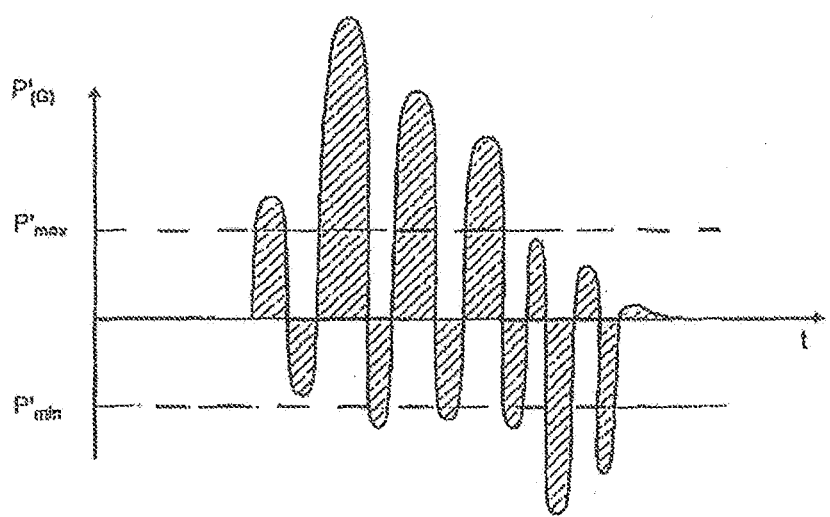
FIG. 3c shows the course of the first derivation for the function shown in FIG. 3b.
Figure 4B:
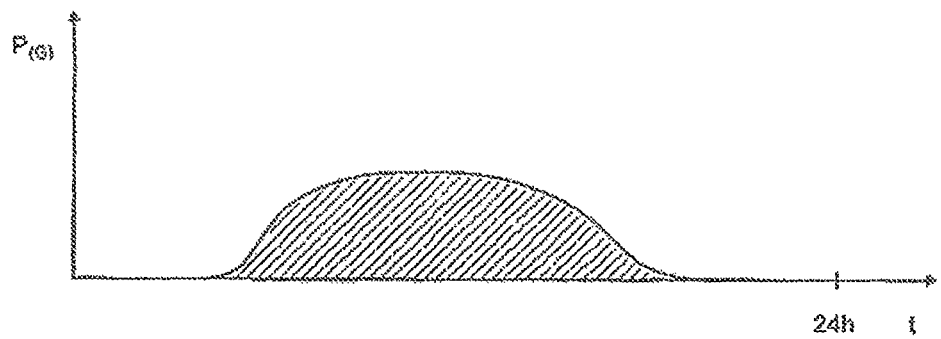
FIG. 4b shows the schematic curve of the power P for this day with overcast sky.
Figure 4C:
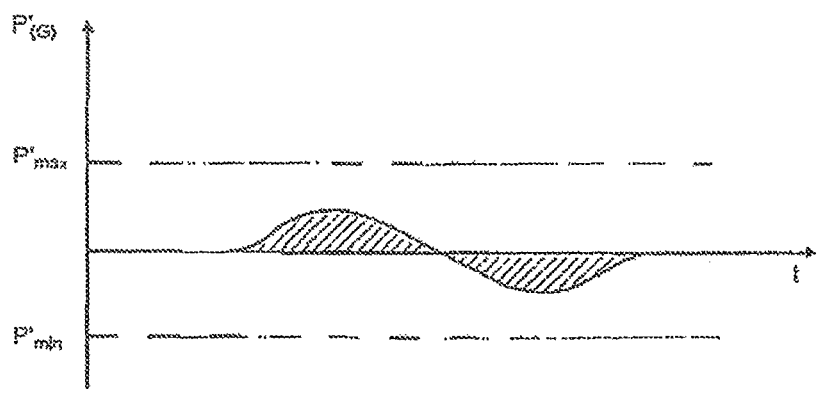
FIG. 4c shows the curve of the first derivation for the function shown in FIG. 4b.

Preferably, in a first step, the first derivation P'(t) of the power curve P(t) is formed and evaluated for each day, as shown in the FIGS. 2c, 3c and 4c.

FIG. 2b shows the cloudless, sunny day. A plurality of measurement results are filed in a data bank over the day. These results are shown in the curve through measurement points on the curve. The curve has a day maximum peak, which is typically about noon. The area below the curves corresponds to the curve integral or to the energy.

FIG. 3b schematically shows the power curve for passing clouds. A kind of harmonics, which are generated by the periodical shadowing through the clouds, are superimposed on a basic curve, which corresponds to the curve in FIG. 2b.

In order to be capable of determining a power reduction of the solar module with very high accuracy, data having a comparable power curve P(t) of the photovoltaic module or of the solar plant are preferably observed over several years. As they are comparable, it is possible to make a reliable statement with respect to power reduction of the photovoltaic module. In principle, completely cloudy days as illustrated in FIG. 4a or 4b or days with passing clouds as shown in the FIG. 3a or 3b are in principle suited for comparison. A comparison with cloudless days is however preferred, i.e., a curve as shown in FIG. 2a or 2b is compared year by year.

The measurement method preferably uses the power curve P(t) as well as the energy output E that corresponds to the area enclosed by the curve. This area is hatched in the FIGS. 2b, 3b and 4b. Both are evaluated. Through this measurement method, additional information such as outside temperature or radiation data is not needed. Sensors are not needed either since the power data are measured from the variable of the photovoltaic module that has been delivered. A voltage, a current or both can be measured. It is also possible to directly measure the power.

The FIGS. 2c through 4c show the first derivation P'(t) of the functions shown in the FIGS. 2b through 4b.

FIG. 4b shows an example for the curve of the power of the photovoltaic generator as a function of time (t) for a day with overcast sky. In FIG. 4c, there is for example shown the associated first derivation with respect to time. As opposed to a cloudless day, the maximum power Pmax can however be significantly less.

In a first step, the function P'(t) is formed.

The first derivation P'(t) can be evaluated in different ways. The evaluation clearly indicates whether the day is cloudless or not, as shown in FIG. 3c.

In a second step, one then analyzes and makes certain whether a cloudless day has indeed been found. For this purpose, the power curve P(t) or its first derivation P'(t) is evaluated. Preferably, two evaluation steps are utilized in order to reliably acquire a comparable cloudless day.

In one of the steps, the first derivation P'(t) is evaluated. For this purpose, there are two possibilities of evaluating the first derivation P'(t). A first possibility is based on the fact that the evaluation method is based on analyzing a maximum for P'(t). If, as shown in FIG. 2c, the maximum value P'max is for example below an imposed limit (upper dashed line) or if the minimum value P'min is above an imposed limit P'min (lower dashed line), it is supposed that the day is cloudless.

As shown in FIG. 3c, the first derivation of the power curve for a day with passing clouds has a much higher maximum value P'max but also a much lower minimum value P'min than the first derivation of the power curve for a cloudless day shown in FIG. 2c. In the FIGS. 2c, 3c and 4c, the upper limit P'max and the lower limit P'min are also shown as dashed lines. Such limit values can also be defined for certain regions. This is possible because average radiation values are known in principle for all the regions in a country. Since radiation values are not only known for regions but also e.g., for certain cities, fine-tuning is possible. These limit values are advantageously acquired and fixed for e.g., a cloudless day in the first year the plant is in operation. Then, verification is performed in the course of the years. Thus, even long-term climatic changes in a region due to climate change can be taken into consideration.

As shown in FIG. 4c, the values of the first derivation of the power curve for an overcast day are also below or above the imposed limits. Another criterion can be readily used to undoubtedly and automatically locate a cloudless day. This is advantageous because a completely cloudy day yields a daily power curve P(t) that is similar to that of a cloudless day.

A second possibility of evaluating the first derivation P'(t) is described herein after. In this variant of the evaluation method, P'(t) is also formed from the power curve P(t) for each day.

For each day, the integral is for example determined $$I = 1 \text{ Tag }.intg.\text{ Tag}(P'(t)t)2t \#\#EQU00003\#\#$$

If the value I acquired lies below a maximum allowable limit l_max so that I<l_max, it can be assumed that the day is cloudless and this day can be included in calculating the power reduction. This limit is obtained from typical radiation values and depends for example on the geographical situation. The corresponding day is then fixed according to the same pattern as in the previous example of the evaluation method of P'(t).

The integral I is a measure for the area included in the first derivation P'(t). A comparison between the FIGS. 2c and 4c clearly shows that the area enclosed by the curve is significantly smaller on a cloudy day. This area is determined by the integral I. This means, if I<l_max, the day may also be cloudy. Therefore, it is appropriate to perform an additional evaluation step.

In another possibility of evaluating the first derivation P'(t), only the zero crossings of the P'(t) are taken into consideration. If the day is for example cloudless, the number of zero crossings of the curve P(t) is equal to 1. This zero crossing takes place at the time of power maximum, as shown in FIG. 2c. If more than one zero crossing is located, as is illustrated in FIG. 3c, it can be assumed that the day is not cloudless.

Herein after, the second step of evaluating the power curve P(t) is described in closer detail.

Since in the first step it is at first only supposed that the day is cloudless or not, this must be confirmed in a second step.

There are different variants to achieve this. The first possibility is to evaluate the daily power curve P(t) in the second step.

The first method for evaluating the daily power curve P(t) consists in determining the daily energy output Etag and in comparing it with an imposed minimum value. If the daily energy output Etag exceeds this minimum value, it is certain that the day is cloudless.

The second evaluation method in the second step consists in evaluating the extreme values of the power curve P(t). For this purpose, an absolute value of the power Pabs is acquired from the host of data P(t) measured within one day. It may for example be the maximum value Pmax of the power P(t) for the day observed or also an average of several power maxima. If this value Pabs lies within a tolerance band ranging from Pabs_min to Pabs_max, then it may well be a relatively cloudless day. Indirectly one also considers the radiation intensity and the duration without the need for an additional sensor.

This method can be even further improved by using the measurement or the measurement values of the temperature of the modules and/or of the outside temperature.

What is claimed is:

1. An evaluation method for determining a power reduction due to ageing of a photovoltaic module, comprising:
    measuring an electric variable representing a power performance of the photovoltaic module using a data logger in one or more predetermined time periods within a given year, each time period defining a class;
    constructing power curves of discrete power values, each power curve constructed from the measured electric variable at a plurality of times of a day within each class, and the power curves constructed for a plurality of years;
    determining energy output values based on the constructed power curves for at least one class for each of the plurality of years using a computation component; and
    determining a power reduction of the photovoltaic module with respect to one or several previous years by calculating a difference between the energy output values of a given class in a particular year and the energy output values of the given class in a year previous to the particular year using the computation component.

2. The evaluation method of claim 1, further comprising confirming whether a weather condition associated with respective power curves in the same predetermined time period of different years is approximately the same to ensure an accuracy of the power reduction determination.

3. The evaluation method of claim 1, wherein determining the energy output values comprises determining areas under the respective constructed power curves.

4. The evaluation method of claim 1, wherein measuring the electric variable during a predetermined time period corresponds to one of multiple available seasons in a given year, wherein the one season comprises the class.

5. The evaluation method of claim 1, wherein measuring the electric variable is performed in two or more distinct predetermined time periods within a given year, wherein each distinct time period corresponds to a different, non-overlapping class.

6. The evaluation method of claim 1, wherein measuring the electric variable is performed in a predetermined time period representing a subset of time of a given year, wherein a weather condition affecting the measured electric variable of the photovoltaic module during the subset of time is consistent from a given year to a next year or to a previous year.

7. The evaluation method of claim 2, wherein confirming the weather condition comprises calculating a first derivative of at least one of the power curves, and drawing a conclusion of a type of weather associated with the day the at least one power curve was constructed.

8. The evaluation method of claim 7, wherein drawing the conclusion further comprises:
   comparing a maximum value or a minimum value of the first derivative to a maximum threshold or a minimum threshold, respectively; and
   initially concluding that the day the at least one power curve was constructed is a cloudless day if an absolute value of either the maximum value or the minimum value exceeds an absolute value of the maximum threshold or the minimum threshold, respectively.

9. The evaluation method of claim 7, wherein drawing the conclusion comprises:
   calculating a number of zeros of the first derivative of at least one of the power curves; and
   initially concluding that the day the at least one power curve was constructed is a cloudless day if the number of zeros is less than a predetermined number.

10. The evaluation method of claim 8, wherein drawing the conclusion further comprises:
   calculating an integral of the first derivative of the at least one power curve to ascertain an area under the curve of the first derivative; and
   comparing the area to a predetermined threshold and concluding the day the at least one power curve was constructed is a cloudless day if the area exceeds the predetermined threshold.

* * * * *